(12) United States Patent
Sumi et al.

(10) Patent No.: US 7,309,669 B2
(45) Date of Patent: Dec. 18, 2007

(54) DIELECTRIC MATERIAL AND DIELECTRIC SINTERED BODY, AND WIRING BOARD USING THE SAME

(75) Inventors: Hiroshi Sumi, Niwa-gun (JP); Masashi Suzumura, Kani (JP); Tsutomu Sakai, Kasugai (JP); Hidetoshi Mizutani, Ama-gun (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 11/165,020

(22) Filed: Jun. 24, 2005

(65) Prior Publication Data

US 2006/0083930 A1 Apr. 20, 2006

Related U.S. Application Data

(62) Division of application No. 10/325,859, filed on Dec. 23, 2002, now abandoned.

(30) Foreign Application Priority Data

| Dec. 25, 2001 | (JP) | ............ P. 2001-390735 |
| Apr. 11, 2002 | (JP) | ............ P. 2002-109646 |

(51) Int. Cl.
*C03C 14/00* (2006.01)
*B32B 17/06* (2006.01)

(52) U.S. Cl. .................. 501/32; 428/426; 428/210; 501/66

(58) Field of Classification Search ............ 501/32, 501/66; 428/210, 426
See application file for complete search history.

(56) References Cited

U.S. PATENT DOCUMENTS

| 4,045,234 A * | 8/1977 | Ring ..................... 501/119 |
| 4,620,264 A | 10/1986 | Ushifusa et al. |
| 4,774,211 A * | 9/1988 | Hamilton et al. ........... 501/153 |
| 4,810,528 A | 3/1989 | Kondo et al. |
| 4,812,422 A | 3/1989 | Yuhaku et al. |
| 5,206,190 A | 4/1993 | Jean et al. |
| 5,232,765 A | 8/1993 | Yano et al. |
| 5,702,996 A | 12/1997 | Kawakami et al. |
| 5,725,808 A | 3/1998 | Tormey et al. |
| 5,825,632 A * | 10/1998 | Tanei et al. ............. 361/795 |
| 6,348,424 B1 * | 2/2002 | Hazeyama et al. ........... 501/5 |
| 6,372,676 B1 * | 4/2002 | Kishida et al. ............ 501/5 |
| 6,403,200 B2 * | 6/2002 | Chikagawa et al. ......... 428/209 |
| 6,835,682 B2 * | 12/2004 | Cho et al. ................ 501/32 |
| 6,852,655 B2 * | 2/2005 | Kodera et al. ............. 501/32 |
| 2001/0031690 A1 | 10/2001 | Osamu et al. |

FOREIGN PATENT DOCUMENTS

| EP | 0 697 725 A2 | 2/1996 |
| EP | 1 024 405 A1 | 8/2000 |
| EP | 1 095 915 A2 | 5/2001 |
| GB | 2 360 037 A | 9/2001 |
| JP | 58-151345 A | 9/1983 |
| JP | 61-222957 A | 3/1986 |
| JP | 62-48097 | 3/1987 |
| JP | 63-168904 | 7/1988 |
| JP | 03-141153 A | 6/1991 |
| JP | 05-17211 A | 1/1993 |
| JP | 07-133137 A | 5/1995 |
| JP | 9-86960 A | 3/1997 |
| JP | 9-175853 | 7/1997 |
| JP | 09-241068 A | 9/1997 |
| JP | 10-120436 | 5/1998 |
| JP | 11-214812 | 8/1999 |
| JP | 3033568 | 2/2000 |
| JP | 2002-020162 A | 1/2002 |
| JP | 2002-76194 A | 3/2002 |
| TW | 259924 | 10/1995 |
| WO | WO 94/10098 A1 | 5/1994 |
| WO | WO 98/39784 A1 | 9/1998 |

OTHER PUBLICATIONS

Partial European Search dated May 20, 2003.

* cited by examiner

*Primary Examiner*—Karl Group
(74) *Attorney, Agent, or Firm*—Sughrue Mion Pllc.

(57) ABSTRACT

A dielectric material comprising: a glass powder constituted of a glass comprising Si, B and an alkali metal element, the glass being amorphous in sintering at a temperature of 1,050° C. or lower; and a ceramic filler comprising at least one member of $SiO_2$, $Al_2O_3$ and $3Al_2O_3 \cdot 2SiO_2$, and an alkali metal element, wherein when a total sum of Si converted into $SiO_2$, B converted into $B_2O_3$ and the alkali metal element converted into $A_2O$, wherein A represents an alkali metal element, all of which are contained in the glass, is 100 mole %, the content of the alkali metal element converted into $A_2O$, which is contained in the glass, is 0.5 mole % or less; and when a total sum of at least one member of $SiO_2$, $Al_2O_3$ and $3Al_2O_3 \cdot 2SiO_2$, and the alkali metal element converted into $A_2O$, all of which are contained in the ceramic filler, is 100 mole %, a content of the alkali metal element converted into $A_2O$, which is contained in the ceramic filler, is 0.5 mole % or less.

14 Claims, 3 Drawing Sheets

DIELECTRIC MATERIAL AND DIELECTRIC SINTERED BODY, AND WIRING BOARD USING THE SAME

CROSS REFERENCE TO RELATED APPLICATION

This is a divisional of application Ser. No. 10/325,859 filed Dec. 23, 2002 now abandoned, the entire disclosure of which is incorporated herein by reference.

FIELD OF THE INVENTION

The present invention relates to a dielectric material and a dielectric sintered body, and to a wiring board using the same. More specifically, the invention relates to a dielectric material that can be sintered simultaneously with a conductor comprising a low-melting material such as Ag and Cu as a wiring board material and to a dielectric sintered body obtained by sintering the same. Particularly, the invention relates to a dielectric material having a low dielectric constant and superior high-frequency characteristics and having a wide width in optimum sintering conditions and to a dielectric sintered body obtained by sintering the same. In addition, the invention relates to a wiring board using this dielectric sintered body as a dielectric layer, which is suited for circuits having a high processing speed and high-frequency circuits. The wiring board according to the invention is widely used in high-frequency utilities such as packages for high-frequency MPU and packages of optical communication.

In addition, the present invention also relates to a multilayered wiring board comprising a dielectric layer and a conductor layer, a part of the conductor layer being an entire electrode conductor layer having a forming area of 1 cm² or more, and a process of producing the same. In particular, the invention relates to a multilayered wiring board in which an entire electrode conductor layer is an ground electrode and/or a capacitor electrode and which is suitable for high-frequency applications having a strip line or micro-strip line.

BACKGROUND OF THE INVENTION

In recent years, in many cases, wiring boards are used in high-frequency regions having a frequency band in the order of GHz or more, with an increase in speed of information communication. Thus, in order to reduce a transfer loss of electric signals, the wiring boards are desired to use a metal having low conductor resistance, such as Ag and Cu, as a conductor layer thereof, thereby reducing a conductor loss. For this reason, low temperature-sintering materials that can be sintered simultaneously with a low-melting metal such as Ag and Cu and that have superior high-frequency dielectric characteristics are being compared and investigated.

Now, there are known crystallized glasses as a low temperature-sintering material having superior high-frequency characteristics, in which crystals having superior high-frequency characteristics crystallize during the sintering step.

As these crystallized glasses, there are, for example, known (1) crystallized glass of a spinel type crystal (for example, JP-A-9-175853(The term "JP-A" as used herein means an "unexamined published Japanese patent application")), (2) crystallized glass of diopside (for example, JP-A-10-120436), and (3) crystallized glass of alumina and anorthite (for example, JP-A-2000-143332).

In addition, multilayered wiring boards that can realize relatively high-density wiring are widely used as wiring boards mounted with a semiconductor element such as LSI, IC, and discrete parts, or having a varied thick-film printing element incorporated therein. Most of these multilayered wiring boards are an alternate laminate of a dielectric layer comprising a glass ceramic and a conductor layer mainly composed of a metal conductor such as Cu, Ag, Au, W, and Mo, and if desired, a semiconductor element is mounted on the surface thereof.

Further, in recent years, in radiocommunication including portable telephone, in order to enlarge the radio resource and realize high density of the transmission volume, there have been positively employed high-frequency bands from micro-wave bands to millimeter wave bands. As parts for radiocommunication instruments to be used, demands of multilayered wiring boards for dealing with high-frequency signals are explosively increasing.

In the case of dealing with the high-frequency signals, since a conductor layer connecting a working electric source of an electronic part to the electronic part contributes as an inductance, there may possibly occur inconveniences that are not problematic in low-frequency signals, such as generation of malfunction caused by superimposition of noises on wirings in the conductor layer, delay of operation response of electronic parts, and transmission loss of high-frequency signals. In order to inhibit such inconveniences inherent to the high-frequency signals, it is required to use multilayered wiring boards in which the conductor layer is constituted of a low-resistivity material, whereas the dielectric layer is constituted of a material having a low specific dielectric constant and a low dielectric loss in a high-frequency band.

However, in the case where Ag or Cu having a low resistivity is employed as the material constituting the conductor layer, since such a metal is low in melting point, in order to form a multilayered wiring board by simultaneously sintering the conductor layer and the dielectric layer, it is required to use a dielectric material that can be sintered at a low sintering temperature of from 800 to 1,050° C. As such materials that can be sintered at low temperatures and have a low specific dielectric constant and a low dielectric loss in a high-frequency band are proposed various crystallized glasses that are mainly composed of a borosilicate glass and in which crystals are crystallized at the sintering stage.

As examples of these crystallized glasses are enumerated ones in which crystals of a spinel type structure are crystallized (JP-A-9-175853), ones in which crystals of diopside are crystallized (JP-A-10-120436), and ones in which crystals of alumina, etc. are crystallized (Japanese Patent Application No. 10-320612).

Further, in order to enhance the transmission characteristics of high-frequency signals, there is proposed a multilayered wiring board in which a part of the conductor layer is constituted as a strip line or micro-strip line (for example, JP-A-11-214812). In the case where such a strip line or micro-strip line is formed, it is necessary to coat one surface of the dielectric layer substantially entirely and to form the entire electrode conductor layer, which functions as the ground conductor, as a part of the conductor layer. From the standpoint of enhancement of the transmission characteristics of high-frequency signals, it is desired that the entire electrode conductor layer is formed in a multilayered state inside the multilayered wiring board. Further, with the modulation of wiring boards, there is a demand such that the entire electrode conductor layer is formed as a capacitor electrode, thereby forming a module wiring board with a built-in capacitor.

SUMMARY OF THE INVENTION

However, in these crystallized glasses, a crystallinity is liable to vary depending on the sintering conditions, and hence, the high-frequency characteristics are influenced by the change of the sintering conditions, resulting in a problem of readily causing scattering. For this reason, the range of conditions such as optimum sintering temperature is narrow.

Further, the crystallized glass is once softened during the sintering step and thereafter loses fluidity with the progress of the crystallization. Accordingly, warp is liable to generate during the sintering step, and it is difficult to revise the warp by changing the sintering conditions. In contrast, in the case where a non-crystallized glass is used, such a problem hardly occurs. However, in the non-crystallized glass, though there is no problem in low-frequency regions of about 1 MHz, a dielectric loss often abruptly increases in high-frequency regions. Thus, it is not desired that the non-crystallized glass is used in the high-frequency regions.

In order to solve the foregoing problems, a first embodiment of the invention has been made and is aimed to provide a dielectric material having a wide width of sintering conditions, in which a dielectric sintered body after sintering has both characteristics of a low dielectric constant and a low dielectric loss and to provide a dielectric sintered body. Further, the first embodiment of the invention is aimed to provide a dielectric material that can undergo degreasing with a good efficiency, thereby stably obtaining a dielectric sintered body and a dielectric sintered body, and to provide a wiring board using the same.

The dielectric material according to the first embodiment of the invention comprises a glass powder constituted of a glass containing Si, B and an alkali metal element, the glass being amorphous in sintering at a temperature of 1,050° C. or lower; and a ceramic filler containing at least one member of $SiO_2$, $Al_2O_3$ and $3Al_2O_3 \cdot 2SiO_2$, and an alkali metal element, wherein when the total sum of Si converted into $SiO_2$, B converted into $B_2O_3$ and the alkali metal element converted into $A_2O$, wherein A represents an alkali metal element, all of which are contained in the glass, is 100 mole %, a content of the alkali metal element converted into $A_2O$, which is contained in the glass, is 0.5 mole % or less; and when the total sum of at least one member of $SiO_2$, $Al_2O_3$ and $3Al_2O_3 \cdot 2SiO_2$, and the alkali metal element converted into $A_2O$, all of which are contained in the ceramic filler, is 100 mole %, a content of the alkali metal element converted into $A_2O$, which is contained in the ceramic filler, is 0.5 mole % or less.

Another dielectric material according to the first embodiment of the invention comprises a glass powder constituted of a glass containing Si, B and an alkali metal element, the glass being amorphous in sintering at a temperature of 1,050° C. or lower; and a ceramic filler containing at least one member of $SiO_2$, $Al_2O_3$ and $3Al_2O_3 \cdot 2SiO_2$ but not containing an alkali metal element, wherein when the total sum of Si converted into $SiO_2$, B converted into $B_2O_3$ and the alkali metal element converted into $A_2O$, wherein A represents an alkali metal element, all of which are contained in the glass, is 100 mole %, a content of the alkali metal element converted into $A_2O$, which is contained in the glass, is 0.5 mole % or less.

Also, the glass can further contain Al and/or an alkaline earth metal element, and when the total sum of Si converted into $SiO_2$, B converted into $B_2O_3$, the alkali metal element converted into $A_2O$, wherein A represents an alkali metal element, Al converted into $Al_2O_3$ in the case where Al is contained, and the alkaline earth metal element converted into EO, wherein E represents an alkaline earth metal element, in the case where the alkaline earth metal element is contained, is 100 mole %, the total sum of Si converted into $SiO_2$ and B converted into $B_2O_3$ is from 80 to 95 mole %.

Further, the ceramic filler may not contain an alkaline earth metal element.

Also, the ceramic filler can further contain an alkaline earth metal element, and when the total sum of at least one member of $SiO_2$, $Al_2O_3$ and $3Al_2O_3 \cdot 2SiO_2$, the alkali metal element converted into $A_2O$, in the case where the alkali metal element is contained, and the alkaline earth metal element converted into EO, wherein E represents an alkaline earth metal element, all of which are contained in the ceramic filler, is 100 mole %, a content of the alkaline earth metal element converted into EO is 1 mole % or less.

Further, when the total sum of the glass powder and the ceramic filler is 100% by volume, the glass powder can account for from 55 to 70% by volume, and the ceramic filler can account for from 30 to 45% by volume.

The dielectric sintered body according to the first embodiment of the invention is one obtained by sintering the dielectric material, wherein when the total sum of Si converted into $SiO_2$, B converted into $B_2O_3$, the alkali metal element converted into $A_2O$, wherein A represents an alkali metal element, Al converted into $Al_2O_3$ in the case where Al is contained, and the alkaline earth metal element converted into EO, wherein E represents an alkaline earth metal element, in the case where the alkaline earth metal element is contained, all of which are contained in the glass, is 100 mole %, and at least one member of $SiO_2$, $Al_2O_3$ and $3Al_2O_3 \cdot 2SiO_2$, the alkali metal element converted into $A_2O$, in the case where the alkali metal element is contained, and the alkaline earth metal element converted into EO, wherein E represents an alkaline earth metal element, all of which are contained in the ceramic filler, is 100 mole %, a content of the alkali metal element converted into $A_2O$ is 0.5 mole % or less.

The wiring board according to the first embodiment of the invention comprises a dielectric layer comprising the dielectric sintered body and a conductor layer provided on the surface of or inside the dielectric layer, the conductor layer comprising at least one member selected from Ag, Au and Cu.

In the case where a conductor layer containing the entire electrode conductor layer (hereinafter sometimes abbreviated as "electrode layer") and a dielectric layer using the crystallized glass are simultaneously sintered to prepare a multilayered wiring board (second embodiment of the invention), as shown in a schematic view of FIG. 4, there is a problem that a blister or gap is liable to generate due to differences in the sintering temperature and sintering shrinkage behavior between the dielectric layer and the conductor layer. This is because since the crystallized glass has a nature such that it is abruptly sintered and shrunk during the sintering step, the sintering shrinkage behavior of the entire electrode conductor, layer cannot follow it. Especially, such a blister or gap is liable to generate in the entire electrode conductor layer (forming area: 1 cm² or more) having a large contact area with the dielectric layer. The generation of such a blister or gap results in inconveniences such as reduction in mechanical strength due to reduction of adhesiveness between the conductor layer and the dielectric layer and increase of the resistivity. Further, these inconveniences become remarkable when the entire electrode conductor layer is formed in a multilayered state in the multilayered wiring board.

The blister or gap generated in the electrode layer occurs due to a difference of the shrinkage behavior caused by differences in the sintering temperature and sintering shrinkage behavior between the dielectric layer and the conductor layer during the sintering. Thus, from the standpoint of reducing the difference of the shrinkage behavior, it is attempted to regulate the amount of the metal conductor component mainly constituting the conductor layer or to add a metal conductor different from the metal conductor mainly constituting the conductor layer to the conductor layer. For example, JP-A-63-168904 and JP-A-62-48097 propose such devices.

However, in the mere device to the constitutional components of the conductor layer, in many cases, the inconveniences such as blister generated in the electrode layer cannot be inhibited. Further, in order to inhibit the inconveniences, a large amount of additives (such as metal oxides) different from the metal conductor mainly constituting the conductor layer must be added to the conductor layer, leading to another problem to bring an increase of the resistivity of the conductor layer.

Further, in the case where the conductor layer mainly formed from low-resistivity Cu or Ag and the dielectric layer formed by using a glass are simultaneously sintered, it is necessary that the sintering be carried out at a sintering temperature lower than the melting point of the metal, namely, at a low sintering temperature of from 800 to 1,050° C. Accordingly, the sintering temperature region at which the simultaneous sintering with the dielectric layer can be carried out is limited depending on the species of the metal constituting the conductor layer. In addition, in the case where the high-frequency signal is handled, the dielectric layer is required to have a low specific dielectric constant and a low dielectric loss, suited for the high-frequency signal. Accordingly, a degree of crystallization in the crystallized glass must be regulated, and hence, the sintering temperature region will be made narrower. As a result, by the mere device on the constitutional components of the conductor layer as in the related art, it becomes more difficult to inhibit the inconveniences generated in the electrode layer without worsening the electric characteristics such as resistivity in the conductor layer. In the light of the above, during the simultaneous sintering of the dielectric layer and the conductor layer mainly composed of Cu or Ag, it is preferred that the width of optimization of the sintering conditions such as sintering temperature is as wide as possible. Further, during the simultaneous sintering of the dielectric layer and the conductor layer using Cu to form a wiring board, in order to prevent the oxidation of Cu, the sintering is carried out in a neutral atmosphere or reductive atmosphere. For this reason, in particular, it is preferred that the width of optimization of the sintering conditions is as wide as possible.

In carrying out the simultaneous sintering, the dielectric layer is sintered and formed in a state where besides the constitutional components, a binder that is usually composed of an organic material is contained, or a state where debinding is effected in advance to some extent. The binder is degreased and removed in the sintering stage or debinding stage in advance. However, when the sintering is carried out in a state where the debinding is incomplete, the constitutional components forming the dielectric layer become minute before the binder has completely come out, whereby a passage through which the binder comes out is clogged, leading to a problem such that the debinding becomes difficult. Taking into consideration these problems; it is preferred that the width of optimization of the sintering conditions in the simultaneous sintering is as wide as possible.

Under these circumstances, a second embodiment of the invention was made. That is, an object of the second embodiment of the invention is to provide a wiring board in which even in the case where the dielectric layer and the conductor layer are simultaneously sintered, not only inconveniences such as blister generated between the conductor layer (especially, the entire electrode conductor layer having a forming area of 1 cm$^2$ or more) and the dielectric layer are inhibited, but also electric characteristics represented by resistivity of the conductor layer to be formed can be enhanced, especially the dielectric layer and the conductor layer suited for high-frequency signals can be formed, and the productivity can be enhanced, and to provide a process of producing the same.

In order to overcome the foregoing problems, the multilayered wiring board according to the second embodiment of the invention comprises a dielectric layer constituted of a glass having a crystallization temperature exceeding 1,000° C. and a ceramic filler and a conductor layer mainly constituted of a metal conductor, wherein a part of the conductor layer is constituted as an entire electrode conductor layer having a forming area of 1 cm$^2$ or more.

In the multilayered wiring board according to the second embodiment of the invention, as the glass that is the raw material of the glass matrix constituting the dielectric layer, one having a crystallization temperature exceeding 1,000° C. is used. Accordingly, in the case where the dielectric layer is sintered simultaneously with the conductor layer mainly constituted of a low-melting metal conductor such as Ag and Cu by sintering at from 800 to 1,000° C., the glass matrix constituting the dielectric layer can be formed as one in which the crystallization is inhibited during the sintering or one in which no crystallization occurs. For this reason, it is possible to inhibit the difference in shrinkage behavior caused by the particles of the constitutional components of the dielectric layer and the conductor layer during the sintering. As a result, when the dielectric layer and the conductor layer are subjected to simultaneous sintering, it is possible to inhibit the inconveniences such as blister and peeling generated in the conductor layer, especially the entire electrode conductor layer having a forming area of 1 cm$^2$ or more (hereinafter sometimes simply referred to "electrode layer"), which constitutes a part of the conductor layer. Furthermore, it is possible to enhance the electric characteristics of the conductor layer, such as resistivity.

As described in the second embodiment of the invention, when the dielectric layer is formed by using a glass in which the crystallization is inhibited during the sintering step, or a glass in which no crystallization occurs, it is possible to widen the width of the sintering conditions such as the sintering temperature for simultaneous sintering of the dielectric layer and the conductor layer. Furthermore, it is possible to enhance the productivity of the multilayered wiring board to be formed.

In the glass that will be a glass matrix constituting the dielectric layer of the second embodiment of the invention, it is necessary to inhibit at least the crystallization during the sintering. More preferably, it is necessary that no crystallization occurs. The crystallization is liable to occur as the sintering temperature increases above the crystallization temperature. For this reason, it is preferred that in order to form the dielectric layer minutely, the crystallization temperature of the glass to be used in the second embodiment of the invention is as high as possible. Incidentally, what the crystallization of the glass is inhibited during the sintering means that the crystallization of the glass does not substantially occur during the time when the dielectric layer becomes minute. Accordingly, ones in which the glass is crystallized by a post-treatment (for example, prolonging the holding time at the sintering temperature) after the dielectric layer has become minute should be included in the concept of the dielectric layer of the second embodiment of the invention. Further, even in the case where after the dielectric layer has become minute, the glass is crystallized, since the simultaneous sintering of the dielectric layer and the conductor layer is already completed, warp caused by mismatching of the sintering shrinkage does not occur.

As a matter of course, it is desired that the metal conductor mainly constituting the conductor layer in the multilayered wiring board according to the second embodiment of the invention is of a low resistivity. Especially, in the case of dealing with high-frequency signals, from the standpoint of transmission characteristics of the high-frequency signals, it is desired that the resistivity of the conductor layer is low. As such a metal conductor can be enumerated silver-based conductors (such as silver alone, silver-metal oxide (oxides of, e.g., manganese, vanadium, bismuth, aluminum, silicon, copper (hereinafter simply referred to as "metal oxide")), silver-glass, silver-palladium, silver-platinum, and silver-rhodium), gold-based conductors (gold alone, gold-metal oxide, gold-palladium, gold-platinum, and gold-rhodium), and copper-based conductors (such as copper alone, copper-metal oxide, copper-palladium, copper-platinum, and copper-rhodium).

From the standpoints of resistivity and melting point of the metal conductor to be used, among the foregoing metal conductors, those formed from at least one of Au, Ag and Cu are optimum.

In addition, among Cu, Ag and Au, Cu and Ag are of a low resistivity. Accordingly, those mainly composed of Cu or Ag are suitable as the metal conductor mainly constituting the conductor layer. Especially, those mainly composed of Cu that is superior in anti-migration to Ag are suitable as the metal conductor mainly constituting the conductor layer. Further, in the second embodiment of the invention, since the dielectric layer is sintered at from 800 to 1,000° C. using the glass having a crystallization temperature exceeding 1,000° C., sintering proceeds slowly as compared with the case or using a glass having a low crystallization temperature. Accordingly, even in the case where the simultaneous sintering is carried out in a neutral atmosphere or a reductive atmosphere by using one mainly composed of Cu as the conductor layer, the passage through which the binder comes out is hardly clogged, so that the conductor layer can be made superior in debinding properties.

Next, the multilayered wiring board according to the second embodiment of the invention is characterized in that the entire electrode conductor layer is an ground electrode and/or a capacitor electrode.

It is desired that the ground electrode that is necessary in the case where a part of the conductor layer functions a strip line or a micro-strip line, or the capacitor electrode that is necessary in the case where a capacitor (including known capacitors such as laminate type capacitors in the concept) is built in the multilayered wiring board corresponding to high-frequency signals, is not only formed as a part of the conductor layer but also has a forming area as large as possible, i.e., a forming area of at least 1 cm$^2$. Such ground electrode and capacitor electrode correspond to the entire electrode conductor layer.

As described above, in the second embodiment of the invention, since nevertheless the crystallized glass is used, the dielectric layer is sintered while inhibiting the crystallization during the sintering, it is possible to inhibit the blister or gap that is conventionally generated in the conductor layer, especially the entire electrode conductor layer (forming area: 1 cm$^2$ or more) due to the difference in abrupt shrinkage behavior with the progress of crystallization of the crystallized glass during the sintering. For this reason, the entire electrode conductor layer functioning as the ground electrode or capacitor electrode can have a forming area of at least 1 cm$^2$. As a result, not only the functions as the ground electrode and the capacitor electrode can be enhanced, but also the transmission characteristics of high-frequency signals in the multilayered wiring board to be formed can be enhanced.

Also, in addition to the forming area of the electrode layer, even in the case where the electrode layer is formed in a multilayered state inside the multilayered wiring board, it is possible to inhibit effectively the blister or gap generated in the electrode layer.

In addition, since it is not necessary to add a large quantity of additives different from the metal conductor for inhibiting the blister or gap to the conductor layer, it is possible to reduce the resistivity of the conductor layer. By using any one of the foregoing metal conductors, the conductor layer can have a volume resistivity of $4 \times 10^{-6}$ Ωcm or less (particularly $3 \times 10^{-6}$ Ωcm or less, and further particularly $2.5 \times 10^{-6}$ Ωcm or less). As a result, not only the electric characteristics of the multilayered wiring board can be enhanced, but also the transmission loss in high-frequency signals can be inhibited.

Next, in the second embodiment of the invention, in order that the multilayered wiring board is more suitable for the high-frequency signals, it is desired that the specific dielectric constant and the dielectric loss of the dielectric layer are as low as possible. Specifically, the specific dielectric constant may be 7 or less, and the dielectric loss in a high high-frequency band of 10 GHz or more may be 0.002 or less.

In order that the dielectric layer has the above-specified specific dielectric constant and dielectric loss, the glass as a constitutional component of the dielectric layer can comprise $SiO_2$ and $B_2O_3$ as major components and $Al_2O_3$ and an alkaline earth metal oxide as sub-components, with a content of the major components being from 80 to 95 mole %. Preferably, the glass consists essentially of $SiO_2$ and $B_2O_3$ as major components and $Al_2O_3$ and an alkaline earth metal oxide as sub-components. More preferably, the glass consists of $SiO_2$ and $B_2O_3$ as major components and $Al_2O_3$ and an alkaline earth metal oxide as sub-components. Further, by using the glass comprising such components, even when the crystallization temperature exceeds 1,000° C., and the sintering is carried out at from 800 to 1,000° C., the glass is not crystallized. Accordingly, it is possible to relieve effectively the mismatching of the sintering shrinkage behavior during the simultaneous sintering with the metal conductor such as Cu.

In the second embodiment of the invention, the content of $SiO_2$ and $B_2O_3$ (hereinafter sometimes abbreviated as "major components") as the major components of the glass is from 80 to 95 mole %. When the content of the major components exceeds 95 mole %, crystals caused by $SiO_2$, such as cristobalite, exist in the sintering step (sintering temperature: 1,000° C. or lower). On the other hand, when the content of the major components is less than 80 mole %, there occur inconveniences such that the specific dielectric constant or dielectric loss in a high-frequency band of the formed dielectric layer becomes high. Taking into consideration these matters, it is desired that the content of the major components is from 80 to 95 mole %.

In addition, in the second embodiment of the invention, $Al_2O_3$ and an alkaline earth metal oxide as sub-components of the glass have an effect for inhibiting the crystallization caused by the major components in the sintering step, and desirably, the content of each of $Al_2O_3$ and the alkaline earth metal oxide is from 3 to 10 mole %.

When the content of $Al_2O_3$ is less than 3 mole %, crystals caused by $SiO_2$ exist in the sintering step. On the other hand, when the content of $Al_2O_3$ exceeds 10 mole %, there occur inconveniences such that $Al_2O_3$ crystals and faldspar caused by $Al_2O_3$ exist in the sintering step. Taking into consideration these matters, it is suitable that the content of $Al_2O_3$ in the glass is from 3 to 10 mole %.

When the content of the alkaline earth metal oxide is less than 3 mole %, the melting of the glass as the major components in the sintering step becomes difficult. On the other hand, when it exceeds 10 mole %, there occur inconveniences such that crystals caused by the alkaline earth metal oxide exist in the sintering step. Taking into consideration these matters, it is desired that the content of the alkaline earth metal oxide is from 3 to 10 mole %.

As the alkaline earth metal oxide can be enumerated MgO, CaO, SriO, and BaO. Among them, MgO is liable to cause crystallization in the sintering step, and SrO and Bao excessively increase the specific dielectric constant of the formed dielectric layer. Therefore, it is particularly optimum to choose CaO. When CaO is chosen as the alkaline earth metal oxide, not only it is possible to easily inhibit the generation of crystallization caused by the constitutional components of the glass during the sintering, but also it becomes possible to reduce the specific dielectric constant of the dielectric layer.

In the conventional glasses, for the purpose of decreasing the melting temperature of the glass, it was necessary to add alkali metals and metal components such as Pb and Sb to the glass. However, the formation of oxides caused by these metal component in the sintering step increases the dielectric loss of the dielectric layer in a high-frequency band. However, in the second embodiment of the invention, it is possible to sinter and form the dielectric layer by sintering at 1,000° C. or lower without containing alkali metals and metal components such as Pb and Sb in the glass powder. As a result, it is possible to inhibit inconveniences such as an increase of the dielectric loss in a high-frequency band by the oxides caused by the metal components. Furthermore, it is possible to further reduce the dielectric loss of the formed dielectric layer in a high-frequency band.

Also, in the second embodiment of the invention, with respect to the entire electrode conductor layer, in addition to the function of an ground conductor of, e.g., a strip line corresponding to high-frequency signals, there may be the case where the entire electrode conductor layer is formed as an ground conductor as a shield portion for noise protection irrespective of the frequency of high-frequency signals. Even in such case, as described in the second embodiment of the invention, it is possible to inhibit inconveniences such as blister or gap as generated during the sintering.

Next, the process of producing the multilayered wiring board according to the second embodiment of the invention comprises sintering a multilayered wiring board molding comprising a green material mainly constituted of a glass having a crystallization temperature exceeding 1,000° C. and a ceramic filler and a conductor layer mainly constituted of a metal conductor, a part of the conductor layer being constituted as an entire electrode conductor layer having a forming area of 1 cm² or more, at a temperature lower than the crystallization temperature of the glass.

Since the crystallization temperature of the glass constituting the green material that will be the dielectric layer by sintering exceeds 1,000° C., even in the case where simultaneous sintering with the conductor layer mainly composed of a metal conductor having a low melting point, such as Ag and Cu, is carried out by sintering at from 800 to 1,000° C., it is possible to form the glass constituting the dielectric layer as a glass in which the crystallization is inhibited during the sintering, or a glass in which no crystallization occurs. For this reason, it is possible to inhibit the difference in shrinkage behavior caused in particles of the constitutional components between the dielectric layer and the conductor layer during the sintering. As a result, when the dielectric layer and the conductor layer are subjected to simultaneous sintering, it is possible to inhibit the inconveniences such as blister and peeling generated in the conductor layer, especially the entire electrode conductor layer having a forming area of 1 cm² or more, which constitutes a part of the conductor layer. Furthermore, it is possible to produce a multilayered wiring board, namely a multilayered wiring board, having enhanced electric characteristics of the conductor layer, such as resistivity.

Further, in the production process according to the second embodiment of the invention, since the glass constituting the green material is a glass in which the crystallization is inhibited during the sintering step, or a glass in which no crystallization occurs, it is possible to widen the width of the sintering conditions such as the sintering temperature for simultaneous sintering of the dielectric layer and the conductor layer. As a result, by widening the width of the sintering conditions, it is possible to enhance the debinding properties of a binder comprising an organic material, which is contained in the green material, in the sintering step.

The multilayered wiring board produced by the production process according to the second embodiment of the invention has the same effects as in the above-described multilayered wiring board according to the second embodiment of the invention. However, in order that the dielectric layer has a specific dielectric constant of 7 or less and a dielectric loss of 0.002 or less in a high-frequency band of 10 GHz or more, it is possible to make the glass powder in the production process according to the second embodiment of the invention have $SiO_2$ and $B_2O_3$ as major components and $Al_2O_3$ and an alkaline earth metal oxide as sub-components, with a content of the major components being from 80 to 95 mole %.

Figure 1:
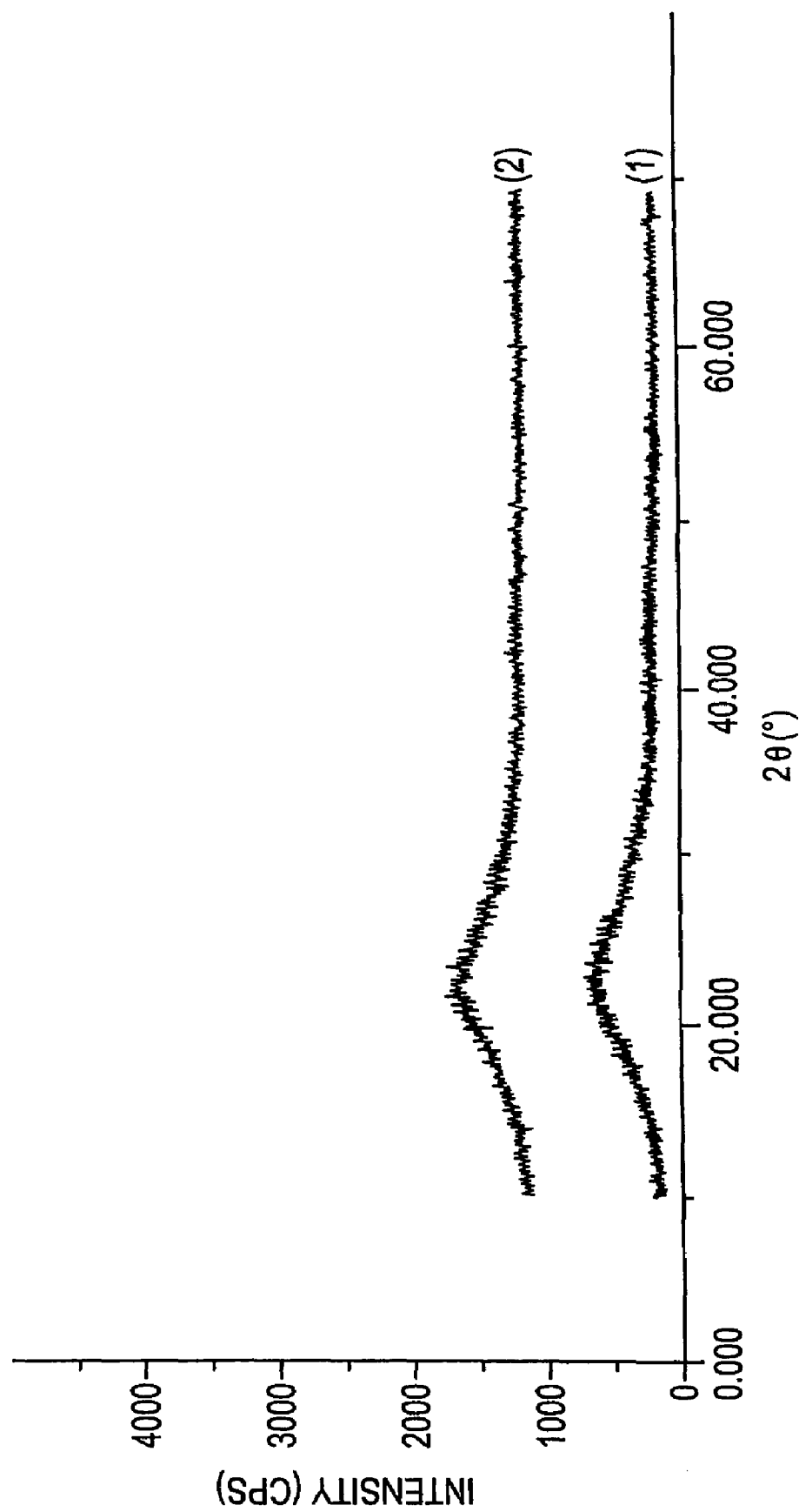
[FIG. 1]

A graph showing the results of X-ray diffraction of an unsintered material and sintered material of glass B.

[FIG. 2]

An outline cross-sectional view showing one embodiment of the multilayered wiring board according to the second embodiment of the invention.

[FIG. 3]

A schematic view showing the multilayered wiring board in the Examples.

[FIG. 4]

A schematic view explaining inconveniences as generated in the conductor layer.

DESCRIPTION OF THE REFERENCE NUMERALS AND SIGNS

1: Multilayered wiring board
2: Dielectric layer
3: Conductor layer
11: Entire electrode conductor layer

DETAILED DESCRIPTION OF THE INVENTION

[1] Dielectric Material:

The dielectric material (one before sintering, which is hereinafter sometimes simply referred to as "material") according to the first embodiment of the invention contains a glass powder and a ceramic filler. The glass powder preferably has a mean particle size of from 0.5 to 5 µm, and more preferably from 1 to 3 µm.

The "glass powder" is constituted of a glass containing Si, B and an alkali metal element, the glass being amorphous in sintering at a temperature of 1,050° C. or lower.

The term "amorphous" means that no peak is confirmed in the X-ray diffraction. That is, it can be confirmed whether or not the "glass" is amorphous by the matter that when the glass powder is sintered at 1,050° C. for 2 hours and then subjected to X-ray diffraction measurement, no peak is present in the X-ray diffraction.

Further, what Si and B are contained means that the glass is constituted of a borosilicate glass. Accordingly, these are contained mainly as oxides of Si and B.

Moreover, examples of the alkali metal element that is contained in the glass include Li, Na, and K. Still further, the alkali metal element is contained usually as its oxide. Also, the alkali metal element may be contained singly or in admixture of two or more thereof.

In addition, when the total sum of Si converted into $SiO_2$ (hereinafter referred to as "Si converted into oxide"), B converted into $B_2O_3$ (hereinafter referred to as "B converted into oxide") and the alkali metal element converted into $A_2O$ (hereinafter referred to as "alkali metal element converted into oxide"), wherein A represents an alkali metal element, is 100 mole %, a content of the alkali metal element converted into $A_2O$, which is contained in the glass, is 0.5 mole % or less, preferably 0.3 mole % or less, and more preferably 0.2 mole % or less. When the content of the alkali metal element converted into oxide exceeds 0.5 mole %, a dielectric loss of the dielectric sintered body after sintering becomes large.

In the first embodiment of the invention, what the total sum of Si, B and the alkali metal element (A) each converted into oxide is 100 mole % means that the total sum of Si converted into $SiO_2$, B converted into $B_2O_3$ and A converted into $A_2O$ is 100 mole % but does not mean mole % of Si, B and the alkali metal element contained in the oxides. Concretely, assuming that 10 mole % of $B_2O_3$ is contained in the glass, the mole % of "B converted into $B_2O_3$" is 10 mole % but not the mole % of "B contained in $B_2O_3$" (namely, 20 mole %).

This glass preferably has a yielding point of from 700 to 850° C., and more preferably from 720 to 800° C. When the yielding point is lower than 700° C., it is difficult to remove carbon generated from a binder during the sintering. On the other hand, when it exceeds 850° C., the sintering temperature is too high, so that it becomes difficult to undergo the sintering simultaneously with metals such as Au, Ag, and Cu, and hence, such is not preferred.

The glass is not particularly limited so far as it is a borosilicate glass that is amorphous in the sintering at 1,050° C. or lower. But, it may further contain Al and/or an alkaline earth metal element.

At this time, when the total sum of Si converted into oxide, B converted into oxide, the alkali metal element converted into oxide, Al converted into $Al_2O_3$ (hereinafter referred to as "Al converted into oxide") in the case where Al is contained, and the alkaline earth metal element converted into EO (hereinafter referred to as "alkaline earth metal element converted into oxide), wherein E represents an alkaline earth metal element (hereinafter the same), in the case where the alkaline earth metal element is contained, all of which are contained in the glass, is 100 mole %, the total sum of Si and B each converted into oxide is preferably from 80 to 95 mole %, more preferably from 82 to 93 mole %, and most preferably from 85 to 90 mole %. When the total sum of Si and B each converted into oxide is less than 80 mole %, the dielectric loss becomes large, whereas when it exceeds 95 mole %, $SiO_2$-based crystals (such as cristobalite) crystallize, and hence, the both are not preferred.

Further, when the total sum of Si converted into oxide, B converted into oxide, the alkali metal element converted into oxide, Al converted into oxide, and the alkaline earth metal element converted into oxide in the case where the alkaline earth metal element is contained, all of which are contained in the glass, is 100 mole %, the content of Al converted into oxide is preferably from 3 to 10 mole %. When the content of Al converted into oxide is less than 3 mole %, $SiO_2$-based crystals are liable to crystallize during the sintering, whereas when it exceeds 10 mole %, $Al_2O_3$-based crystals or faldspar is liable to crystallize during the sintering, and hence, the both are not preferred.

Though examples of the alkaline earth metal element include Ca, Mg, Sr, and Ba, Ca is particularly preferred. Mg is liable to crystallize Mg-based crystals such as enstatite and cordierite during the sintering, and Sr and Ba are liable to increase the dielectric constant of the dielectric sintered body after the sintering, and hence, the both are not preferred.

In addition, when the total sum of Si converted into oxide, B converted into oxide, the alkali metal element converted into oxide, Al converted into oxide in the case where Al is contained, and the alkaline earth metal element converted into oxide, all of which are contained in the glass, is 100 mole %, the content of the alkaline earth metal element converted into oxide is preferably from 3 to 10 mole %. When the content of the alkaline earth metal element converted into oxide is less than 3 mole %, melting of the glass is difficult, whereas when it exceeds 10 mole %, crystals are liable to crystallize during the sintering, and hence, the both are not preferred.

The "ceramic filler" means one containing at least one member of $SiO_2$, $Al_2O_3$ and $3Al_2O_3 \cdot 2SiO_2$ (mullite).

While the ceramic filler may be one containing an alkali metal element, those not containing an alkali metal element are preferred. This is because in the case where the alkali metal element is contained, an increase of dielectric loss of the dielectric sintered body after the sintering is liable to occur. Here, what the alkali metal element is not contained means that in the chemical analysis (ICP emission), its detection amount is smaller than the measurement limit. Further, in the case where the alkali metal element is contained, when the total sum of at least one member $SiO_2$, $Al_2O_3$ and $3Al_2O_3 \cdot 2SiO_2$ and the alkali metal element converted into oxide, all of which are contained in the ceramic filler, is 100 mole %, the content of the alkali metal element converted into oxide is 0.5 mole % or less, preferably 0.3 mole % or less, and more preferably 0.2 mole % or less. When the content of the alkali metal element converted into oxide exceeds 0.5 mole %, the dielectric loss of the dielectric sintered body after the sintering becomes large, and hence, such is not preferred.

In addition, while the ceramic filler may be one containing an alkaline earth metal element, those not containing an alkaline earth metal element are preferred. This is because in the case where the alkaline earth metal element is contained, an increase of dielectric loss of the dielectric sintered body after the sintering is liable to occur. Here, what the alkaline earth metal element is not contained means that in the chemical analysis (ICP emission), its detection amount is smaller than the measurement limit.

Further, in the case where the alkaline earch metal element is contained, when the total sum of at least one member of $SiO_2$, $Al_2O_3$ and $3Al_2O_3.2SiO_2$, the alkali metal element converted into oxide in the case where the alkali metal element is contained, and the alkaline earth metal element converted into oxide, all of which are contained in the ceramic filler, is 100 mole %, the content of the alkaline earth metal element converted into oxide is 1 mole % or less, preferably 0.5 mole % or less, and more preferably 0.2 mole % or less. When the content of the alkali metal element converted into oxide exceeds 1 mole %, the dielectric loss of the dielectric sintered body after the sintering becomes large, and hence, such is not preferred.

The ceramic filler may be in a powdered state or fibrous state, but preferably is in a powdered state. In the case where the ceramic filler is in a powdered state, it preferably has a mean particle size of from 0.5 to 5 μm, and more preferably from 1 to 3 μm.

Examples of the ceramic filler include an alumina powder, a mullite powder, a quartz powder; and a silica glass powder. Of these, the alumina powder is preferred because it can enhance the strength of the dielectric sintered body. Incidentally, these ceramic fillers may be used singly or in admixture of two or more thereof depending upon the dielectric constant, strength and coefficient of thermal expansion required for the dielectric sintered body. Further, in the case where two or more of the ceramic fillers are used in combination, ones having an alumina powder mixed therewith are preferred because they can enhance the strength of the dielectric sintered body after the sintering.

With respect to the proportions of the glass power and the ceramic filler to be contained, when the total sum of the glass powder and the ceramic filler is 100% by volume, it is preferred that the glass powder accounts for from 55 to 70% by volume, and the ceramic filler accounts for from 30 to 70% by volume, and it is more preferred that the glass powder accounts for from 55% by volume or more but less than 65% by volume, and the ceramic filler accounts for more than 35% by volume but 45% by volume or less. When the amount of the glass powder is less than 55% by volume, a minute sintered body is hardly obtained during the sintering, whereas when it exceeds 70% by volume, the debinding properties are lowered, and hence, the both are not preferred. Incidentally, the term "% by volume" means a volume ratio in a true volume, and the true volume of each of the glass powder and the ceramic filler is determined by dividing a weight of each powder by a particle density of each powder. The particle density of the powder can be measured by known methods (such as the pycnometer method of JIS R 1620 "Testing Method for Particle Density of Fine Ceramic Powder").

The dielectric material according to the first embodiment of the invention is usually obtained by compounding the glass powder and the ceramic filler further with at least a solvent and a binder.

The binder is not particularly limited so far as it is generally used as a binder. But, acrylic resin-based binders such as acrylic resins and butyral resins are preferred, and acrylic resins are particularly preferably used. The binder may be used singly or in admixture of two or more thereof.

When the total sum of the glass powder and the ceramic filler is 100 parts by weight, a compounding amount of the binder is from 1 to 30 parts by weight, and preferably from 3 to 25 parts by weight.

In addition, the solvent is not particularly limited so far as it is a solvent generally used for dielectric materials. But, examples include toluene, methyl ethyl ketone, acetone, and isopropyl alcohol. Of these are preferable toluene and methyl ethyl ketone. The solvent may be used singly or in admixture of two or more thereof.

When the total sum of the glass powder and the ceramic filler is 100 parts by weight, a compounding amount of the solvent is from 10 to 150 parts by weight, and preferably from 20 to 120 parts by weight.

If desired, the dielectric material according to the first embodiment of the invention may be further compounded with a plasticizer. Such compounding is carried out for the purpose of enhancing the processing properties of a green sheet.

Examples of the plasticizer that can be used include dibutyl phthalate, 2-ethylhexyl phthalate, and 2-ethylhexyl adipate, with dibutyl phthalate being preferred. The plasticizer may be used singly or in admixture of two or more thereof. When the total sum of the glass powder and the ceramic filler is 100 parts by weight, a compounding amount of the plasticizer is from 3 to 20 parts by weight, and preferably from 5 to 15 parts by weight.

[2] Dielectric Sintered Body:

The dielectric sintered body according to the first embodiment of the invention is obtained by sintering the dielectric material.

When the dielectric sintered body is obtained from the dielectric material according to the first embodiment of the invention, it is usually carried out to mold the dielectric material prior to the sintering.

The molding can be carried out by known molding methods represented by sheet molding by the doctor blade process (including a laminate of plural sheets), film formation by the screen printing process, and press molding.

With respect to the conditions for carrying out the "sintering", the sintering is carried out at from 800 to 1,050° C., and preferably from 900 to 1,000° C. for from 0.5 to 10 hours, and preferably from 1 to 5 hours. When the sintering temperature is lower than 800° C., sufficient sintering is hardly achieved, whereas when it exceeds 1,050° C., growth of metallized abnormal particles (Cu) to be simultaneously sintered occurs, and hence, the both are not preferred. Further, when the sintering time is shorter than 0.5 hour, sufficient sintering is hardly achieved, whereas when it exceeds 10 hours, growth of metallized abnormal particles (Cu) to be simultaneously sintered occurs, and hence, the both are not preferred.

Further, the dielectric sintered body according to the first embodiment of the invention may contain an alkali metal element such as Li, Na, and K. But, it is preferred that the content of the alkali metal element is low.

When the total sum of Si converted into oxide, B converted into oxide, the alkali metal element converted into oxide, Al converted into oxide in the case where Al is contained, and the alkaline earth metal element converted into oxide in the case where the alkaline earth metal element is contained, all of which are contained in the glass of the dielectric sintered body, and at least one member of $SiO_2$, $Al_2O_3$ and $3Al_2O_3.2SiO_2$, the alkali metal element converted into oxide in the case where the alkali metal element is contained, and the alkaline earth metal element converted into oxide in the case where the alkaline earth metal element is contained, all of which are contained in the ceramic filler, is 100 mole %, a content of the alkali metal element converted into oxide is 0.5 mole % or less, preferably 0.3 mole % or less, and more preferably from 0.2 mole % or less. When the content of the alkali metal element converted into oxide exceeds 0.5 mole %, the dielectric loss becomes large, and hence, such is not preferred.

[3] Wiring Board:

The wiring board according to the first embodiment of the invention comprises a dielectric layer comprising the dielectric sintered body of the first embodiment of the invention and a conductor layer provided on the surface of or inside the dielectric layer.

Further, the conductor layer comprises at least one member selected from Ag, Au and Cu.

The wiring board can be, for example, prepared by the following method.

That is, in the case of the wiring board having the conductor layer formed on the surface of the dielectric layer, the glass powder, the ceramic filler, the binder, and the solvent are mixed in predetermined ratios as described above. At this time, if desired, the above-described plasticizer and the like may be compounded. Thereafter, the mixture is molded into a green sheet of the dielectric material by the above-described molding method. Next, a conductor layer pattern comprising at least one member of Au, Ag and Cu is formed on the surface of the green sheet by the screen printing process or the like.

Then, the green sheet having the conductor layer formed on the surface thereof is sintered under the sintering conditions as described above. There is thus obtained the wiring board according to the first embodiment of the invention.

Further, in the case of the wiring board having the conductor layer formed inside the dielectric layer, the green sheet having the conductor layer formed on the surface thereof is laminated with other green sheet such that it covers the conductor layer, and the laminate is sintered under the sintering conditions as described above. There is thus obtained the wiring board having the conductor layer formed inside the dielectric layer.

In the case where the dielectric sintered body according to the first embodiment of the invention is measured at TE011 mode and at a resonance frequency of from 8 to 12 GHz according to JIS R 1627, it has a specific dielectric constant of 5.8 or less, and preferably 5.7 or less and a dielectric loss of 0.0015 or less, preferably 0.0013 or less, and more preferably 0.0011 or less.

One embodiment of the multilayered wiring board according the second embodiment of the invention will be described below.

Figure 2:
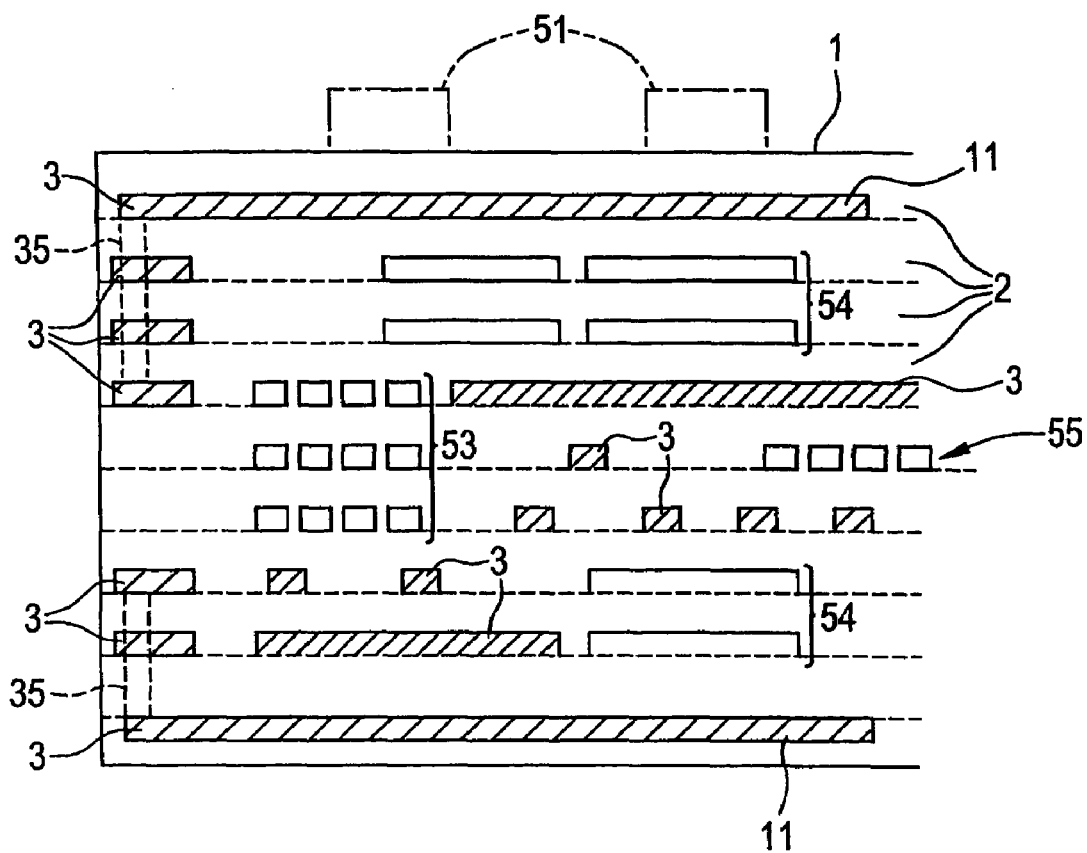

FIG. 2 schematically shows an outline cross-sectional view of a multilayered wiring board 1 (hereinafter sometimes abbreviated as "board 1"), in which a dielectric layer 2 and a conductor layer 3 are alternately formed, and if desired, a semiconductor element 51 is mounted on the surface thereof. Respective wiring layers playing a role of wiring in the conductor layer 3 are electrically connected to each other by via holes 35 each penetrating through the wiring layer in the thickness direction. Further, in FIG. 2, there is constituted an entire electrode conductor layer 11 in which a part of the conductor layer 3 functions as an ground conductor for noise protection. In order that the board 1 functions as a high-frequency board, a part of the wiring layer in the conductor layer 3 can be constituted as a strip line. For example, the wiring board 1 may be a high-frequency package or one provided with an active element function having an ability for processing high-frequency signals itself, or may be one mounting a high-frequency element individually constituted, such as an antenna switch module.

In addition, the board 1 of this embodiment is incorporated with various thick-film circuit elements such as a capacitor 54, an inductor 53, and a resistor 55, in addition to the conductor layer 3, but it may be constituted as a board having only the conductor layer 3 without particularly having the thick-film circuit elements. Further, the board 1 can be applied to known wiring boards such as a mode comprising a high-frequency wiring layer 10 such as a high-frequency micro-strip line. Moreover, the capacitor electrode in the capacitor 54 in FIG. 2 can be made the entire electrode conductor layer 11.

In FIG. 2, the electrode layer 11 that functions as the shield portion for noise protection, functions as the ground conductor such as strip line, or functions as the capacitor electrode is required to be large so as to have a forming area of 1 cm$^2$ or more. However, when the dielectric layer 2 using a crystallized glass and the conductor layer 3 containing the electrode layer 11 are simultaneously sintered, there was hitherto a problem that blister or gap is liable to generate in the formed conductor layer 3, especially in the electrode layer 11, leading to reduction of the function of the electrode layer 11.

In the second embodiment of the invention, since the glass as a constitutional component of the dielectric layer 2 has a crystallization temperature exceeding 1,000° C., the glass is one in which the crystallization is inhibited during the sintering, or one in which no crystallization occurs at the sintering temperature of from 800 to 1,000° C. Accordingly, it is possible to inhibit the generation of blister or gap as conventionally observed in the formed conductor layer due to the difference in the sintering shrinkage behavior between the dielectric layer and the conductor layer. As a result, it is possible to enhance the electric characteristics such as resistivity in the conductor layer, especially to form a conductor layer suitable for high-frequency signals. Further, since the electrode layer can have a forming area of 1 cm$^2$ or more, and the number of formed layers can be increased, not only the function of the electrode layer can be enhanced, but also a multilayered wiring board suitable for high-frequency signals can be provided.

As the glass constituting the dielectric layer of the second embodiment of the invention can be employed ones comprising $SiO_2$ and $B_2O_3$ as major components and $Al_2O_3$ and an alkaline earth metal oxide as sub-components, in which a content of the major components is from 80 to 95 mole %.

In addition to the metal conductor mainly constituting the conductor layer, in order to improve the matching with the dielectric layer during the sintering, for example, silica, alumina, magnesia, zirconia, titania, mullite, spinel, and glass frit may be added.

While the production process of the glass in the second embodiment of the invention is not particularly limited, one example will be described below. Oxides of raw material elements in the raw material constituting the glass are weighed and mixed such that the material after sintering becomes one as specified previously; and the mixture is, for example, calcined at 1,600° C. in a crucible and then pulverized by a ball mill, etc., to obtain a glass powder. In this case, the pulverization may be achieved such that the glass powder has a mean particle size ranging from 1 to 3 μm. When the mean particle size of the glass powder is larger than 3 μm the mechanical strength of the formed dielectric layer is lowered, whereas when it is smaller than 1 μm, the debinding properties are lowered. Incidentally, the formed glass powder has a crystallization temperature exceeding 1,000° C.

Next, one embodiment of the production process according to the second embodiment of the invention for producing the multilayered wiring board as shown in FIG. 2 will be described below.

A green sheet that will become a dielectric layer is prepared. The green sheet is prepared by compounding a glass powder having a mean particle size ranging from 1 to 3 μm, which can be formed by the foregoing step, with ceramic fillers such as alumina, mullite, aluminum nitride, and silicon nitride and additives such as a binder, a solvent, a plasticizer, a deflocculating agent, a surfactant, and a wetting agent and molding the mixture in a sheet-like state by the doctor blade process or the like.

Examples of the binder include acrylic resins (such as polymethyl methacrylate and poly(t-butyl methacrylate)), cellulose acetate butyrate, polyethylene, polyvinyl alcohol, and polyvinyl butyral; and examples of the solvent include acetone, methyl ethyl ketone, diacetone, methyl isobutyl ketone, benzene, bromochloroethane, ethanol, butanol, propanol, toluene, and xylene.

In addition, examples of the plasticizer include butylbenzyl phthalate, dibutyl phthalate, dimethyl phthalate, di-2-ethylhexyl phthalate, adipic esters, polyethylene glycol derivatives, and tricresol phosphate; examples of the defloculating agent include fatty acids (such as glycerin triolate); examples of the surfactant include benzenesulfonic acid; and examples of the wetting agent include alkylaryl polyether alcohols, polyethylene glycol ethyl ether, ethylphenyl glycol, and polyoxyethylene esters.

On the thus obtained green sheet are formed a plurality of wiring patterns that will become a conductor layer containing an entire electrode conductor layer having a forming area of 1 cm$^2$ or more (in the case of incorporating a thick-film circuit element, its element pattern is also included) by the known screen printing process. Thereafter, another ceramic green sheet is overlaid thereon, and steps of the green sheet formation and green sheet lamination are repeated, followed by heat lamination under pressure. There is thus obtained a multilayered wiring molding having a green material mainly constituted of the glass powder and the ceramic filler and the conductor layer. Incidentally, in the case where the via hole 35 is formed, the green sheet is bored in the position where the via is to be formed by a drill or the like, into which a metal paste is then filled. The thus formed multilayered wiring molding is sintered at the sintering temperature of lower than the crystallization temperature of the glass powder, to obtain a multilayered wiring board that will become a multilayered wiring board.

The multilayered wiring board according the second embodiment of the invention may have a dielectric layer containing the dielectric sintered body according to the first embodiment of the invention. In such a case, a conductor layer is preferably provided on the surface of and/or inside the dielectric layer.

EXAMPLES

The invention will be described below in detail with reference to the Examples.

[1] Example 1

(1) Evaluation of Glass Powder Used in Example 1:

A glass powder (particle size: 2.5 μm) constituted of glass A as shown in Table 1, a binder (acrylic resin), and a solvent (acetone) were mixed, and the mixture was then granulated to obtain a granulated powder of glass A. At this time, the amount of the binder was 4% by weight on a basis of 100% by weight of the mixed powder. Further, the amount of the solvent was 100% by weight on a basis of 100% by weight of the mixed powder. Thereafter, the granulated powder was subjected to uniaxial molding and then to CIP at 150 MPa. Next, the molding was sintered on a ceramic setter in air at a temperature of 950° C. for 2 hours to obtain a sintered material of glass A. Similarly, sintered materials of powders of glass B and glass C, each having a particle size of 2.5 μm, were obtained. Incidentally, in Table 1, the glass marked with "*" falls outside the predetermined amount in terms of the content of the alkali metal element. Further, in Table 1, the "composition (mole %)" column shows the content of each element of Si, B, Al, Na, K, Ca and Mg converted into oxide on a basis of 100 mole % of the total sum of these elements each converted into oxide; and the "In (SiO$_2$+ B$_2$O$_3$+Na$_2$O+K$_2$O) (mole %)" column shows the content of Na, K, or the sum of Na and K converted into oxide on a basis of 100 mole % of the total sum of Si, B, Na and K each converted into oxide. The differences in the glass composition are caused by the differences in the raw materials and conditions of melting crucibles. Further, the glass compositions were identified by the chemical analysis (ICP emission).

The sintered materials of glasses A, B and C were measured for X-ray diffraction. Among the results, the results of X-ray diffraction of an unsintered material and sintered material of glass B are shown in FIG. 1. Incidentally, in FIG. 1, chart (1) shows one before the sintering, and chart (2) shows one after the sintering. It is understood from FIG. 1 that the sintered material of glass B has the same crystals as in the unsintered material. Further, in both of the sintered material and unsintered material of glass B, there is not present a peak at which a crystal is considered to be present. Thus, it can be understood that the sintered material of glass B is amorphous. Incidentally, glasses A and C showed similar results. Thus, it was confirmed that the sintered materials of glasses A, B and C are amorphous.

TABLE 1

|  | Composition (mole %) | | | | | | | In (SiO$_2$ + B$_2$O$_3$ + Na$_2$O + K$_2$O) (mole %) | | |
| --- | --- | --- | --- | --- | --- | --- | --- | --- | --- | --- |
|  | SiO$_2$ | B$_2$O$_3$ | Al$_2$O$_3$ | MgO | CaO | Na$_2$O | K$_2$O | Na$_2$O | K$_2$O | Na$_2$O + K$_2$O |
| Glass A | 63.39 | 24.11 | 5.70 | 0.08 | 6.67 | 0.05 | 0.00 | 0.06 | 0.00 | 0.06 |
| Glass B | 65.77 | 23.59 | 5.39 | 0.07 | 5.05 | 0.06 | 0.06 | 0.07 | 0.07 | 0.13 |
| Glass C* | 62.81 | 24.14 | 6.40 | 0.06 | 6.03 | 0.42 | 0.14 | 0.48 | 0.16 | 0.64* |

(2) Preparation and Evaluation of Dielectric Material and Dielectric Sintered Body:

The glass powder constituted of the glass having the composition as shown in Table 1 and a ceramic filler (particle size: 3 μm) having a composition as shown in Table 2 were mixed in a mixing ratio as shown in Table 3. Incidentally, in Tables 2 and 3, the glass or ceramic filler marked with "*" falls outside the predetermined amount in terms of the content of the alkali metal element. Further, the ceramic filler marked with "*" falls outside the predetermined amount in terms of the content of the alkaline earth metal element. Further, the "composition (mole %)" column shows the content of each of the compounds as shown in Table 2 on a basis of 100 mole % of the total sum of these compounds; and in Table 2, the "In $(SiO_2+Al_2O_3+Na_2O+K_2O)$ (mole %)" column shows the content of $Na_2O$, $K_2O$, or the sum of $Na_2O$ and $K_2O$ on a basis of 100 mole % of the total sum of $SiO_2$, $Al_2O_3$, $Na_2O$ and $K_2O$. The differences in the composition of the ceramic filler are caused by the differences in the raw materials and conditions of melting crucibles. Further, the compositions of the ceramic fillers were identified by the chemical analysis (ICP emission).

Thereafter, the mixed powder was mixed with a binder (acrylic resin binder) and a solvent (acetone), and the mixture was then granulated to obtain a granulated powder of dielectric material. At this time, the amount of the binder was 4% by weight on a basis of 100% by weight of the mixed powder. Further, the amount of the solvent was 100% by weight on a basis of 100% by weight of the mixed powder. Thereafter, the granulated powder was subjected to uniaxial molding and then to CIP at 150 MPa. Next, the molding was sintered on a ceramic setter in air at a temperature of 950° C. for 2 hours to obtain a dielectric sintered body. Next, the dielectric sintered body was processed into a size having a diameter of from 15 to 16 mm and a thickness of from 7.5 to 8 mm. Thereafter, the dielectric sintered body was measured for specific dielectric constant and dielectric loss at TE011 mode and at a resonance frequency of from B to 12 GHz according to JIS R 1627. The results are shown in Table 3.

(3) Advantage of Example 1:

As shown in Table 3, when the total sum of Si, B, Na and K each converted into oxide in the glass is 100 mole %, in the case of using the glass having the content of the alkali metal element converted into oxide exceeding 0.5 mole % (Example 1-3), the specific dielectric constant showed an excellent value as 5.7, but the dielectric loss showed a large value as 0.0016. Further, even by using the glass having the content of the alkali metal element converted into oxide of 0.5 mole % or less, when the total sum of $SiO_2$, $Al_2O_3$, $Na_2O$, and $K_2O$ in the ceramic filler is 100 mole %, in the case of using the ceramic filler containing alumina as the major component and having the content of the alkali metal element converted into oxide exceeding 0.5 mole % (Example 1-5), the specific dielectric constant showed an excellent value as 5.7, but the dielectric loss showed a large value as 0.0017. Accordingly, it can be understood that dielectric sintered bodys using a glass having the content of the alkali metal element exceeding 0.5 mole %, or a ceramic filler having the content of the alkali metal element exceeding 0.5 mole % are inferior in the dielectric characteristics in high-frequency regions.

Further, even if the content of the alkali metal element converted into oxide is 0.5 mole % or less, when the total sum of all of the components shown in Table 2 is 100 mole %, in the case where the content of the alkaline earth metal element converted into oxide largely exceeds 1 mole % (Example 1-8), the specific dielectric constant was large as 6.1, and the dielectric loss was considerably large as 0.0052. Moreover, in the case where the content of the alkaline earth metal element converted into oxide slightly exceeds 1 mole % (Example 1-6), the specific dielectric constant showed an excellent value as 5.7, but the dielectric loss showed a large value as 0.0016. Thus, it can be understood that when the content of the alkaline earth metal element exceeds 1 mole %, the dielectric characteristics in high-frequency regions are inferior.

TABLE 2

| | Composition (mole %) | | | | | | | | In $(SiO_2 + Al_2O_3 + Na_2O + K_2O)$ (mole %) | | |
|---|---|---|---|---|---|---|---|---|---|---|---|
| | $SiO_2$ | $B_2O_3$ | $Al_2O_3$ | MgO | CaO | $Na_2O$ | $K_2O$ | MgO + CaO | $Na_2O$ | $K_2O$ | $Na_2O + K_2O$ |
| Alumina A | 0.00 | 0.00 | 100.0 | 0.00 | 0.00 | 0.00 | 0.00 | 0.00 | 0.00 | 0.00 | 0.00 |
| Alumina B | 0.03 | 0.00 | 99.89 | 0.00 | 0.00 | 0.08 | 0.00 | 0.00 | 0.08 | 0.00 | 0.08 |
| Alumina C* | 0.03 | 0.00 | 99.29 | 0.00 | 0.00 | 0.68 | 0.00 | 0.00 | 0.68 | 0.00 | 0.68* |
| Alumina D** | 0.03 | 0.00 | 97.97 | 0.50 | 1.42 | 0.08 | 0.00 | 1.92** | 0.08 | 0.00 | 0.08 |
| Quartz | 99.97 | 0.00 | 0.02 | 0.00 | 0.00 | 0.01 | 0.00 | 0.00 | 0.01 | 0.00 | 0.01 |
| Wallastonite** | 50.36 | 0.00 | 0.05 | 0.03 | 49.52 | 0.01 | 0.01 | 49.55** | 0.02 | 0.02 | 0.04 |

TABLE 3

| | | | Evaluation results | | |
|---|---|---|---|---|---|
| | Glass | Filler | Glass:Filler (Vol. %) | Specific dielectric constant | Dielectric loss |
| Example 1-1 | A | Alumina B | 64:36 | 5.7 | 0.0010 |
| Example 1-2 | B | Alumina B | 64:36 | 5.7 | 0.0012 |
| Example 1-3 | C* | Alumina B | 64:36 | 5.7 | 0.0016 |
| Example 1-4 | B | Alumina A | 64:36 | 5.7 | 0.0010 |
| Example 1-5 | B | Alumina C* | 64:36 | 5.7 | 0.0017 |
| Example 1-6 | B | Alumina D** | 64:36 | 5.7 | 0.0016 |
| Example 1-7 | B | Quartz | 64:36 | 4.1 | 0.0014 |
| Example 1-8 | B | Wallastonite** | 60:40 | 6.1 | 0.0052 |

On the other hand, in the case where the content of the alkali metal element converted into oxide, which is contained in the glass, is 0.5 mole % or less, the content of the alkali metal element converted into oxide, which is contained in the ceramic filler, is 0.5 mole % or less, and the content of the alkaline earth metal converted into oxide, which is contained in the ceramic filler, is 1 mole % or less (Examples 1-4 to 6), the specific dielectric constant is 5.7 or less, and the dielectric loss is 0.0014 or less. Accordingly, it can be understood that these dielectric sintered bodys are superior in the dielectric characteristics in high-frequency regions.

In the light of the above, it can be understood that nevertheless an amorphous glass is used as the material, the dielectric sintered bodys of this Example are superior in the dielectric characteristics in high-frequency regions.

[2] Example 2

(1) Preparation and Evaluation of Wiring Board:

The glass powder (particle size: 2.5 μm) of glass B as shown in Table 1 and the ceramic filler of alumina B as shown in Table 2 were mixed in a mixing ratio as shown in Table 4 to obtain a mixed powder. Incidentally, the "% by volume" as referred to herein means a rate in the true volume. Further, the true volume is one calculated by dividing the weight of each powder by the particle density. Moreover, the particle density of each of the glass powder and the ceramic filler is measured by the pycnometer method as described in JIS R 1620 "Testing Method for Particle Density of Fine Ceramic Powder".

Thereafter, the mixed powder was mixed with a binder (acrylic resin binder), a plasticizer (dibutyl phthalate), and a solvent (toluene and methyl ethyl ketone) to obtain a dielectric material in a slurry state. At this time, when the weight of the mixed power is 100% by weight, the amount of the binder is 20% by weight. Further, when the weight of the mixed powder is 100% by weight, the amount of the plasticizer is 10% by weight. Moreover, with respect to the amount of the solvent, when the weight of the mixed powder is 100% by weight, the amount of toluene is 25% by weight, and the amount of methyl ethyl ketone is 25% by weight. Next, a green sheet having a thickness of 250 μm was formed from the material in the slurry state by the doctor blade process. Thereafter, a Cu paste was screen printed on the surface of the green sheet, to form an unsintered pattern as a conductor layer. Next, the obtained unsintered laminate was degreased at 850° C. in a moistened nitrogen atmosphere and then sintered at 1,000° C. for 2 hours in a nitrogen atmosphere, to obtain a wiring board.

Warp of the obtained wiring board and the surface state of the dielectric layer were visually observed. The results are shown in Table 4. Further, the cross-section of the dielectric layer was subjected to textural observation by SEM. The results are also shown in Table 4.

TABLE 4

| | Evaluation results | | | |
|---|---|---|---|---|
| | Glass:Filler (Vol. %) | Warp | Surface state | Textural observation |
| Example 2-1 | 75:25 | Yes | Gray and expanded | Bubbled |
| Example 2-2 | 69:31 | No | Gray | Minute |

TABLE 4-continued

| | Evaluation results | | | |
|---|---|---|---|---|
| | Glass:Filler (Vol. %) | Warp | Surface state | Textural observation |
| Example 2-3 | 64:36 | No | Good | Minute |
| Example 2-4 | 60:40 | No | Good | Minute |
| Example 2-5 | 54:46 | No | Good | Porous |

(2) Advantage of Example 2:

As shown in Table 4, in the case where the mixing amount of the glass powder exceeds 70% by volume (Example 2-1), it was confirmed that warp generated in the wiring board, and bubbles generated on the surface and cross-section of the dielectric layer. It is considered that such was caused by the matter that the binder was not thoroughly removed because of a high content of the glass. This material is not suitable for use as a wiring board material.

Further, in the case where the mixing amount of the glass powder is less than 55% by volume (namely, the mixing amount of the ceramic filler exceeds 45% by volume), the wiring board was not sintered because the mixing amount of the ceramic filler was too high. This material is also not suitable for use as a wiring board material.

On the other hand, in the case where the mixing amount of the glass powder is from 55 to 70% by volume (Examples 2-2 to 4), the occurrence of warp was not confirmed, and the states of the surface and the cross-section were good.

Especially, in the case where the mixing amount of the glass powder is from 60 to 64% by volume (Examples 2-3 to 4), carbon as a residue of the binder during the sintering was not detected. Therefore, these wiring boards were especially good.

In the light of the above, the material having a mixing amount of the glass powder of from 55 to 70% by volume is extremely suitable as a wiring board material.

Incidentally, it should be construed that the invention is not limited to these concrete Examples. Depending on the object and utility, there can be provided various specific embodiments by changes within the scope of the invention. For example, other components or inevitable impurities may be contained unless the dielectric characteristics in high-frequency regions are substantially influenced.

Since the dielectric materials according to the present invention and other present invention are constituted of a glass in which the glass powder is amorphous, they have a wide width of sintering conditions such as sintering temperature and pressure, in which a dielectric sintered body after sintering is small in specific dielectric constant and small in dielectric loss in high-frequency regions. Thus, it is possible to obtain a dielectric sintered body having superior dielectric characteristics in high-frequency regions. Further, by containing the glass powder and the ceramic filler in a predetermined ratio, it is possible to obtain a dielectric material that can undergo degreasing with a good efficiency. Moreover, it is possible to use, as a conductor layer, Cu that is complicated in terms of sintering schedule because of its wide width of sintering conditions. In addition, the wiring board according to the invention is substantially free from warp and is superior in high-frequency characteristics in the dielectric layer.

[3] Example 3

According to the production step as described above, 100 parts by weight of a mixed powder having a mean particle size of 2.5 μm of 50 parts by weight of a glass powder comprising $SiO_2$, $B_2O_3$, $Al_2O_3$, and CaO as the alkaline earth metal oxide and 50 parts by weight of a ceramic filler comprising alumina was intimately mixed with 20 parts by weight of a binder (acrylic resin), 10 parts by weight of a plasticizer (dibutyl phthalate), and 75 parts by weight of a solvent (a mixed liquid of toluene and isopropyl alcohol), to prepare a slurry. Next, using the slurry, a green sheet having a thickness of 250 μm was prepared by the doctor blade process. On the surface of the obtained green sheet was pattern printed a Cu paste by the screen printing process to form an electrode layer of 3.6×2.6 $cm^2$ as a conductor layer. Further, steps of the green sheet formation and green sheet lamination were repeated to form three layers as the electrode layer. Thereafter, a green sheet was laminated so as to cover the electrode layer, to form a multilayered wiring molding. Subsequently, the multilayered wiring molding was degreased at 850° C. in a nitrogen atmosphere (reductive atmosphere) and sintered at 1,000° C. for 2 hours. There was thus obtained a multilayered board having the electrode layer formed therein.

Incidentally, the Cu paste was prepared by intimately mixing 100 parts by weight of a copper powder (particle size: 5 μm) mainly constituting the electrode layer, 30 parts by weight of a vehicle, and 0.5 parts by weight of silica using a three-roll mill.

[4] Example 4

A multilayered wiring board was prepared under the same conditions as in Example 3, except that CaO constituting the glass powder in Example 3 was replaced by a mixed powder of 60 parts by weight of a glass powder having MgO and ZnO added thereto and 40 parts by weight of a ceramic filler comprising alumina.

[5] Comparative Example 1

A multilayered wiring board was prepared under the same conditions as in Example 3, except that a mixed powder of 60 parts by weight of a glass powder in which MgO was added to CaO as the component constituting the glass powder in Example 3 and 40 parts by weight of a ceramic filler comprising alumina.

[6] Comparative Example 2

A multilayered wiring board was prepared under the same conditions as in Example 3, except that CaO constituting the glass powder in Example 3 was replaced by a mixed powder of 65 parts by weight of a glass powder having MgO added thereto and 35 parts by weight of a ceramic filler comprising alumina.

The contents of the constitutional components of the glass powders in the Examples and Comparative Examples are shown in Table 5. The crystallization temperature in Table 5 is corresponding to an exothermic peak temperature of a differential thermal curve obtained by measuring a glass powder having the same components and contents as in each of the glass powders of the Examples and Comparative Examples by the known differential thermal analysis (DTA), prior to carrying out each of the Examples and Comparative Examples. The measurement of the differential thermal curve was carried out at a temperature elevation rate of 10° C./min within the range of from 25° C. to 1,100° C. Further, in the glass powder in Example 3, since the crystallization temperature exceeded 1,100° C., no exothermic peak was observed within the temperature range of from 25° C. to 1,100° C.

Incidentally, the crystallization temperature of the glass power as referred to in the specification and claims of this application is corresponding to the exothermic peak temperature of the differential thermal curve as described above.

TABLE 5

| Contents of constitutional components of glass powder (mole %) | | | | | | | |
|---|---|---|---|---|---|---|---|
| | $SiO_2$ | $B_2O_3$ | $Al_2O_3$ | MgO | Cao | ZnO | Crystallization temperature (° C.) |
| Example 3 | 63.3 | 24.1 | 5.7 | — | 6.9 | — | >1,100 |
| Example 4 | 44.8 | 9.7 | 19.2 | 20.2 | — | 4.1 | 1,007 |
| Comparative Example 1 | 46.3 | 7.4 | 17.8 | 19.3 | 9.2 | — | 983 |
| Comparative Example 2 | 35.5 | 13.2 | 9.6 | 41.7 | — | — | 906 |

Each of the multilayered wiring boards as prepared in the Examples and Comparative Examples was cut, and the electrode layer was visually observed under a 20-power magnifying glass.

As a result, as is evident from Table 5, in the multilayered wiring board as prepared in Example 3, in which the crystallization temperature exceeded 1,000° C., blister or peeling was not confirmed in the electrode layer. Further, in the multilayered wiring board as prepared in Example 4, the crystallization temperature exceeded 1,000° C., too. However, since the crystallization temperature of the glass powder was lower than that in Example 3, blister was slightly confirmed in the end portion of the electrode layer. On the other hand, in the multilayered wiring boards as prepared in Comparative Examples 1 and 2, since the crystallization temperature was 1,000° C. or lower, blister or peeling was largely confirmed in the electrode layer.

It was understood from the foregoing results that the multilayered wiring boards as prepared in Examples 3 and 4, each of which was formed from the glass power having a crystallization temperature exceeding 1,000° C., could inhibit blister or peeling in the electrode layer. Further, it was understood that the multilayered wiring board as prepared in Example 3, which was formed from the glass powder having a higher crystallization temperature, could more inhibit blister or peeling in the electrode layer.

[7] Example 5

Figure 3:
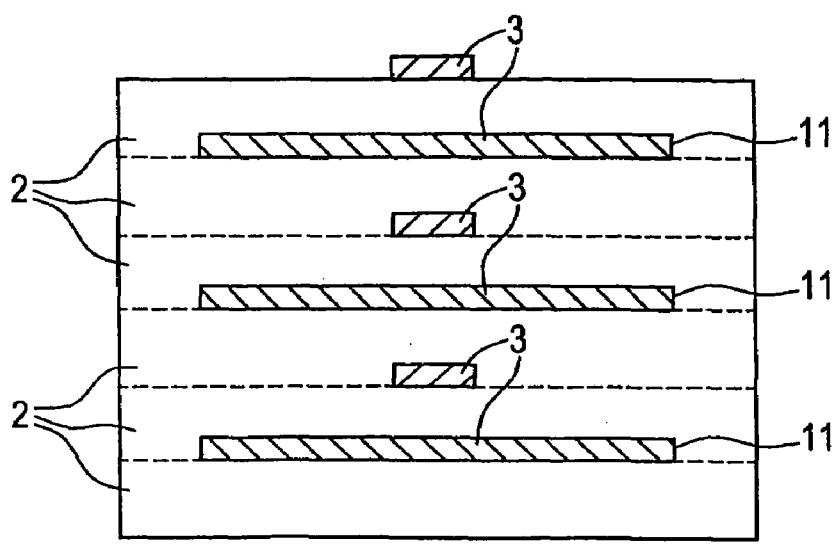
Figure 4:
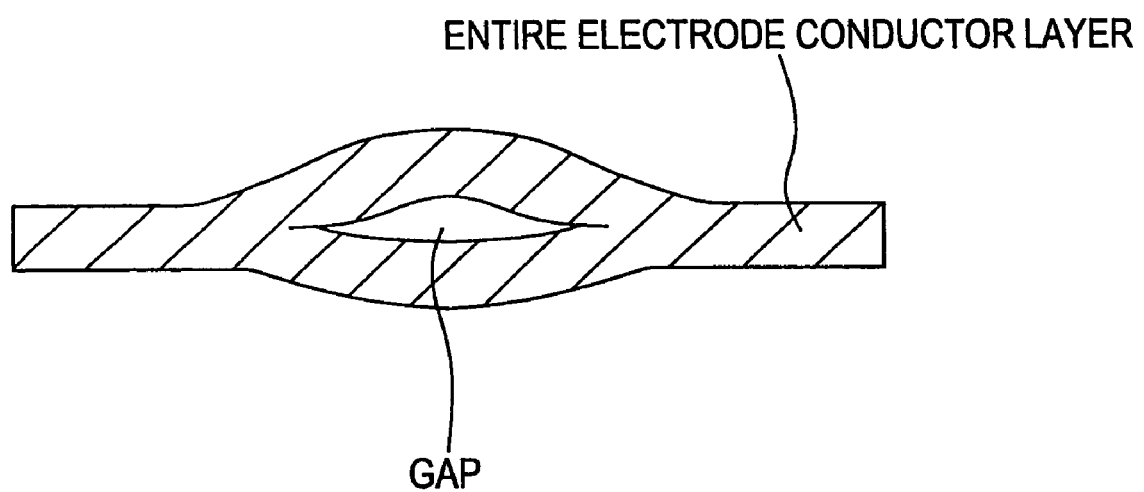

Using the same green sheet and Cu paste as in Example 3, so as to form a multilayered wiring molding as shown in a schematic view of FIG. 3, the Cu paste was screen printed on the surface of the green sheet to form an electrode layer pattern having a forming area of 6 $mm^2$, and then, steps of the green sheet formation and green sheet lamination were repeated to form the multilayered wiring molding having an electrode layer pattern and a wiring pattern formed therein. Thereafter, the multilayered wiring molding was degreased at 850° C. in a nitrogen atmosphere (reductive atmosphere) and sintered at 1,000° C. for 2 hours. There was thus obtained a multilayered wiring board having a strip line and a micro-strip line corresponding to high-frequency signals.

The multilayered wiring board obtained in Example 6 was subjected to dielectric measurement of specific dielectric constant and dielectric loss of the dielectric layer and to resistivity measurement of the conductor wiring as the conductor layer. The dielectric measurement was carried out at TE011 mode (according to JIS R 1627) and at a resonance frequency of from 8 to 12 GHz by the terminal-based short-circuiting dielectric resonator method. Further, a volume resistivity of the conductor layer was determined from resistivity value of the conductor wiring obtained by the resistivity measurement and the length, width and height of the conductor wiring as measured. The both measurements were carried out at a measurement temperature of 25° C.

The dielectric measurement revealed that the specific dielectric constant was 5.8 and that the dielectric loss at 10 GHz was 0.0014. On the other hand, the resistivity measurement revealed that the volume resistivity was $2.4 \times 10^{-6}$ Ωcm.

It was confirmed from the measurement results of Example 6 that the multilayered wiring board having a strip line and a micro-strip line as formed in Example 6 was low in the specific dielectric constant and the dielectric loss in a high-frequency band of the dielectric layer and was low in the resistivity of the conductor layer and hence, was suitable for high-frequency signals.

Incidentally, the high frequency as referred to in the specification and claims of this application means that the frequency is 1 GHz or more.

It was confirmed from the foregoing Examples that in the multilayered wiring boards according to the invention, even in the case where a conductor layer is constituted of a material having a low resistivity and a low melting point, such as Cu, it is possible to inhibit inconveniences such as blister or gap as generated in a part of an electrode layer of the conductor layer, and furthermore, it is possible to reduce the resistivity of the conductor layer, thereby enhancing transmission characteristics of high-frequency signals.

This application is based on Japanese Patent application JP 2002-109646, filed Apr. 11, 2002, and Japanese Patent application JP 2001-390735, filed Dec. 25, 2001, the entire contents of those are hereby incorporated by reference, the same as if set forth at length.

What is claimed is:

1. A dielectric sintered body obtained by sintering a dielectric material at 800 to 1,050° C., the dielectric material comprising a glass powder comprising Si, B and an alkali metal element, the glass being amorphous in sintering at a temperature of 1,050° C. or lower; and a ceramic filler comprising at least one member of $SiO_2$, $Al_2O_3$ and $3Al_2O_3 \cdot 2SiO_2$, and alkali metal element,
wherein:
   (A) Si converted into $SiO_2$, B converted into $B_2O_3$, the alkali metal element converted into $A_2O$, wherein A represents an alkali metal element, Al converted into $Al_2O_3$ in a case where Al is contained, and an alkaline earth metal element converted into EO, wherein E represents an alkaline earth metal element, in a case where the alkaline earth metal element is contained, all of which are contained in the glass, is defined to be 100 mole %, and
   (B) at least one member of $SiO_2$, $Al_2O_3$ and $3Al_2O_3 \cdot 2SiO_2$, the alkali metal element converted into $A_2O$, and an alkaline earth metal element converted into EO, wherein E represents an alkaline earth metal element, in a case where an alkaline earth metal element is contained, all of which are contained in the ceramic filler, is defined to be 100 mole %, the alkaline metal converted into $A_2O$ in each of the glass and the ceramic filler is present in an amount of 0.5 mole % or less.

2. A wiring board comprising: a dielectric layer comprising the dielectric sintered body according to claim 1; and a conductor layer provided at least one of on a surface of and inside of the dielectric layer, the conductor layer comprising at least one member selected from Ag, Au and Cu.

3. A multilayered wiring board comprising:
   a dielectric layer comprising a dielectric sintered body according to claim 1, and
   a conductor layer comprising a metal conductor,
   wherein a part of the conductor layer is an entire electrode conductor layer having a forming area of 1 cm² or more.

4. The multilayered wiring board according to claim 1, wherein the entire electrode conductor layer is at least one of an ground electrode and a capacitor electrode.

5. The multilayered wiring board according to claim 3, wherein the dielectric layer has a specific dielectric constant of 7 or less and a dielectric loss of 0.002 or less in a high-frequency band of 10 GHz or more.

6. The multilayered wiring board according to claim 3, wherein the glass comprises $SiO_2$, $B_2O_3$, $Al_2O_3$ and an alkaline earth metal oxide, in which a content of a sum of $SiO_2$ and $B_2O_3$ is from 80 to 95 mole %, and a crystal phase caused by a crystallization of the glass does not exist in the dielectric layer.

7. The multilayered wiring board according to claim 3, wherein the glass consists essentially of $SiO_2$, $B_2O_3$, $Al_2O_3$ and an alkaline earth metal oxide, in which a content of a sum of $SiO_2$ and $B_2O_3$ is from 80 to 95 mole %, and a crystal phase caused by a crystallization of the glass does not exist in the dielectric layer.

8. A process for producing a multilayered wiring board, which comprises: sintering a multilayered wiring molding comprising a green material comprising a glass and a ceramic filler and a conductor layer comprising a metal conductor, a part of the conductor layer being an entire electrode conductor layer having a forming area of 1 cm² or more, at a temperature lower than the crystallization temperature of the glass to form a multilayered wiring board comprising a dielectric layer comprising a dielectric sintered body according to claim 1.

9. The process according to claim 8, wherein the glass comprises $SiO_2$ and $B_2O_3$, $Al_2O_3$ and an alkaline earth metal oxide, in which a content of a sum of $SiO_2$ and $B_2O_3$ is from 80 to 95 mole %.

10. The multilayered wiring board according to claim 3, wherein the conductor layer is provided at least one of: on a surface of; and inside of the dielectric layer, the conductor layer comprising at least one member selected from Ag, Au and Cu.

11. The dielectric sintered body according to claim 1, wherein the glass further comprises at least one of Al and an alkaline earth metal element, and when a total sum of Si converted into $SiO_2$, B converted into $B_2O_3$, the alkali metal element converted into $A_2O$, wherein A represents an alkali metal element, Al converted into $Al_2O_3$ in a case where Al is contained, and the alkaline earth metal element converted into EO, wherein E represents an alkaline earth metal element, in a case where the alkaline earth metal element is contained, is 100 mole %, a total sum of Si converted into $SiO_2$ and B converted into $B_2O_3$ is from 80 to 95 mole %.

12. The dielectric sintered body according to claim 1, wherein the ceramic filler does not comprise an alkaline earth metal element.

13. The dielectric sintered body according to claim 1, wherein the ceramic filler further comprises an alkaline earth metal element, and when a total sum of at least one member of $SiO_2$, $Al_2O_3$ and $3Al_2O_3 \cdot 2SiO_2$, the alkali metal element converted into $A_2O$, and the alkaline earth metal element converted into EO, wherein E represents an alkaline earth metal element, all of which are contained in the ceramic filler, is 100 mole %, a content of the alkaline earth metal element converted into EO is 1 mole % or less.

14. The dielectric sintered body according to claim 1, wherein when the total sum of the glass powder and the ceramic filler is defined to be 100% by volume, the glass powder accounts for from 55 to 70% by volume, and the ceramic filler accounts for from 30 to 45% by volume.

* * * * *